(12) United States Patent
Hsu

(10) Patent No.: US 7,271,633 B2
(45) Date of Patent: Sep. 18, 2007

(54) CHARGE PUMP STRUCTURE FOR REDUCING CAPACITANCE IN LOOP FILTER OF A PHASE LOCKED LOOP

(75) Inventor: Tse-Hsiang Hsu, Hsin-Chu (TW)

(73) Assignee: Mediatek Inc., Hsin-Chu (TW)

(*) Notice: Subject to any disclaimer, the term of this patent is extended or adjusted under 35 U.S.C. 154(b) by 0 days.

(21) Appl. No.: 11/561,899

(22) Filed: Nov. 21, 2006

(65) Prior Publication Data

US 2007/0090863 A1 Apr. 26, 2007

Related U.S. Application Data

(63) Continuation of application No. 10/065,902, filed on Nov. 27, 2002, now Pat. No. 7,161,436.

(51) Int. Cl.
*H03L 7/06* (2006.01)

(52) U.S. Cl. ........................ 327/148; 327/157

(58) Field of Classification Search .......... 327/147, 327/148, 156, 157; 375/373, 374; 331/17, 331/25

See application file for complete search history.

(56) References Cited

U.S. PATENT DOCUMENTS

| 5,424,689 | A | 6/1995 | Gillig et al. | 331/17 |
| 6,546,059 | B1 | 4/2003 | Knoll et al. | 375/294 |
| 6,744,292 | B2 | 6/2004 | Chen et al. | 327/156 |
| 7,120,217 | B2 * | 10/2006 | Schwarzmueller | 375/376 |

* cited by examiner

*Primary Examiner*—Linh My Nguyen
(74) *Attorney, Agent, or Firm*—Winston Hsu

(57) ABSTRACT

A charge pump and loop filter circuit of a phase locked loop includes a resistor, first and second capacitors, first and second input current sources for supplying first and second currents to the circuit, a first output current source for outputting the first current from the circuit, and a second output current source for receiving the second current from the circuit. The charge pump also contains a plurality of up pulse switches and down pulse switches for controlling current flow through the circuit such that only a fraction of the current that flows through the resistor flows into and out of the first capacitor for charging and discharging the first capacitor. The size of the first capacitor can be reduced accordingly based on the amount of current used to charge and discharge the first capacitor.

8 Claims, 15 Drawing Sheets

CHARGE PUMP STRUCTURE FOR REDUCING CAPACITANCE IN LOOP FILTER OF A PHASE LOCKED LOOP

CROSS REFERENCE TO RELATED APPLICATIONS

This continuation application claims the benefit of U.S. application Ser. No. 10/065,902, which was filed on Nov. 27, 2002 now U.S. Pat. No. 7,161,436 and entitled "CHARGE PUMP STRUCTURE FOR REDUCING CAPACITANCE IN LOOP FILTER OF A PHASE LOCKED LOOP".

BACKGROUND OF THE INVENTION

1. Field of the Invention

The present invention relates to a charge pump of a phase locked loop, and more specifically, to an improved charge pump structure allowing for a smaller capacitor to be used in a loop filter of the phase locked loop.

2. Description of the Prior Art

A phase locked loop is used for frequency control. Please refer to FIG. 1. FIG. 1 is a block diagram of a phase locked loop (PLL) 10 according to the prior art. The PLL 10 contains a phase detector 12, which is used for comparing phases of two input signals IN1 and IN2. Based on a phase difference between the two input signals IN1 and IN2, the phase detector 12 then outputs either an up signal UP or a down signal DN to a charge pump circuit 14. Based on receipt of either the up signal UP or the down signal DN, the charge pump circuit 14 sends (or receives) a control current to (from) a loop filter 16. This control current is used for charging or discharging a capacitor within the loop filter 16, as will be explained more thoroughly below. Finally, a control voltage $V_{VCONA}$ is outputted from the loop filter 16 and fed into a voltage controlled oscillator (VCO) 18. The VCO 18 generates the output frequency IN2 based on the control voltage $V_{VCONA}$ that is fed into the VCO 18. Together, the phase detector 12, the charge pump circuit 14, the loop filter 16, and the VCO 18 form the PLL 10, which is a negative feedback loop.

Please refer to FIG. 2A. FIG. 2A is a diagram illustrating operation of the phase detector 12 of the PLL 10 when generating the up signal UP. As stated above, the phase detector 12 compares two inputted signals IN1 and IN2, and outputs either the up signal UP or the down signal DN based on the phase difference between IN1 and IN2. In FIG. 2A, the IN1 signal leads the IN2 signal by a phase difference of θ1. The phase detector 12 is able to detect this phase difference and then outputs a pulse of the up signal UP. A pulse width of the up signal UP is directly proportional to the phase difference θ1 between IN1 and IN2. This up signal UP is ultimately used to increase the frequency of IN2, so that IN1 and IN2 can become in-phase.

Please refer to FIG. 2B. FIG. 2B is a diagram illustrating operation of the phase detector 12 of the PLL 10 when generating the down signal DN. In FIG. 2B, the IN2 signal leads the IN1 signal by a phase difference of θ2. The phase detector 12 is able to detect this phase difference and then outputs a pulse of the down signal DN. A pulse width of the down signal DN is directly proportional to the phase difference θ2 between IN1 and IN2. This down signal DN is ultimately used to decrease the frequency of IN2, so that IN1 and IN2 can become in-phase.

Please refer to FIG. 3A. FIG. 3A is a circuit diagram of the charge pump circuit 14 and the loop filter 16 of the prior art. The charge pump circuit 14 comprises an input current source 20, which is connected to node NA of the charge pump circuit 14, that inputs a current with a magnitude of I, and an output current source 22, which is connected to node NB of the charge pump circuit 14, that outputs a current with a magnitude of I. The charge pump circuit 14 further comprises an up pulse switch swUP connected between node NA and output node VCONA, and a down pulse switch swDN connected between node VCONA and node NB. The loop filter 16 comprises a resistor R connected between the output node VCONA and an intermediate node VCON, and a capacitor C connected between the intermediate node VCON and ground.

When a pulse of the up signal UP is received from the phase detector 12, the up pulse switch swUP is programmed to close for charging the capacitor C. At all other times, the up pulse switch swUP remains open. On the other hand, when a pulse of the down signal DN is received from the phase detector 12, the down pulse switch swDN is programmed to close for discharging the capacitor C. At all other times, the down pulse switch swDN remains open. As shown in FIG. 3A, both the up pulse switch swUP and the down pulse switch swDN are shown open since neither the up signal UP nor the down signal DN are received by the charge pump circuit 14. Therefore, no current is able to flow from the charge pump circuit 14 to the loop filter 16 in order to charge or discharge the capacitor C.

Please refer to FIG. 3B. FIG. 3B is a circuit diagram of the prior art charge pump circuit 14 and loop filter 16 in a charging mode. In FIG. 3B, the charge pump circuit 14 receives a pulse of the up signal UP from the phase detector 12. Therefore, the up pulse switch swUP is closed and the down pulse switch swDN is open. A dotted line is shown illustrating a path of current with the magnitude of I from the input current source 20 through the resistor R and through the capacitor C. Since the current I is flowing through the capacitor C, the voltage across the terminals of the capacitor C will increase, and the capacitor C will be charged according to Eqn.1 shown below.

$$i = C\frac{dv}{dt} \tag{1}$$

Eqn.1 shows that the longer the current I is flowing through the capacitor C, the more charged the capacitor C will become, and the larger a voltage $V_{VCON}$ will be. From Eqn.1, a simple proportionality relationship can be made, which is shown in Eqn.2.

$$\frac{i}{K} = \frac{C}{K} \tag{2}$$

In Eqn.2, K is a constant. The present invention makes great use of Eqn.2, and the significance of this equation will be explained fully below. As mentioned above, the voltage $V_{VCONA}$ is an output voltage that it outputted from the loop filter 16 to the VCO 18 for controlling the VCO 18. Eqn.3 below shows the relationship between the voltage $V_{VCONA}$ and the voltage $V_{VCON}$.

$$V_{VCONA} = IR + V_{VCON} \tag{3}$$

Eqn.3 shows that the voltage $V_{VCONA}$ depends on the sum of the current I flowing through resistor R and the voltage $V_{VCON}$.

Please refer to FIG. 3C. FIG. 3C is a circuit diagram of the prior art charge pump circuit 14 and loop filter 16 in a discharging mode. In FIG. 3C, the charge pump circuit 14 receives a pulse of the down signal DN from the phase detector 12. Therefore, the down pulse switch swDN is closed and the up pulse switch swUP is open. A dotted line is shown illustrating a path of current with the magnitude of I from the capacitor C through the resistor R to the output current source 22. Since the current I is leaving the capacitor C, the voltage across the terminals of the capacitor C will decrease, and the capacitor C will be discharged according to Eqn.1.

Unfortunately, when fabricating the prior art charge pump circuit 14 and loop filter 16 on an integrated circuit (IC), the area of the capacitor C takes up a very large area of the IC. Not only does this increase the cost to manufacture the ICs containing the prior art PLL 10, but it also makes it difficult to design and build smaller ICs due to the large size of the capacitor C.

SUMMARY OF THE INVENTION

It is therefore a primary objective of the claimed invention to provide a charge pump and loop filter circuit for reducing capacitance in the circuit in order to solve the above-mentioned problems.

According to the claimed invention, a charge pump and loop filter circuit of a phase locked loop includes a first input current source electrically connected to a first node of the circuit for supplying a first current to the circuit, the first current being equal to a predetermined amount of current multiplied by a first factor, a second input current source electrically connected to a second node of the circuit for supplying a second current to the circuit, the second current being equal to the predetermined amount of current multiplied by a second factor, a first output current source electrically connected to a third node of the circuit for outputting the first current from the circuit, and a second output current source electrically connected to a fourth node of the circuit for outputting the second current from the circuit. The charge pump and loop filter circuit also includes a unit gain buffer electrically connected between an intermediate node of the circuit and a fifth node of the circuit for supplying a voltage of the intermediate node to the fifth node, a first capacitor electrically connected between the intermediate node and a reference level of the circuit, a resistor electrically connected between the fifth node and an output node of the circuit, a second capacitor electrically connected between the output node of the circuit and the reference level, a plurality of up pulse switches controlled by an up pulse control signal for controlling current flow such that in a charging mode of the circuit, the second current flows from the second node through the output node and through the resistor to the fifth node, and the first current flows from the first node through the intermediate node to the first capacitor for charging the first capacitor, and a plurality of down pulse switches controlled by a down pulse control signal for controlling current flow such that in a discharging mode of the circuit, the second current flows from the fifth node through the resistor and out through the second output current source, and the first current flows from the first capacitor through the intermediate node and out through the first output current source for discharging the first capacitor.

It is an advantage of the claimed invention that the charge pump and loop filter circuit contains more than one input current source, more than one output current source, and the plurality of up pulse switches and down pulse switches. The addition of these common circuit components allows the charge pump to limit the amount of current that is used for charging and discharging the capacitor to only the first current while allowing the second current to flow through the resistor. By lowering the amount of current used for charging and discharging the capacitor, the capacitor can have a correspondingly smaller size. Therefore, use of the claimed invention charge pump and loop filter circuit reduces overall size of an integrated circuit containing a PLL.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
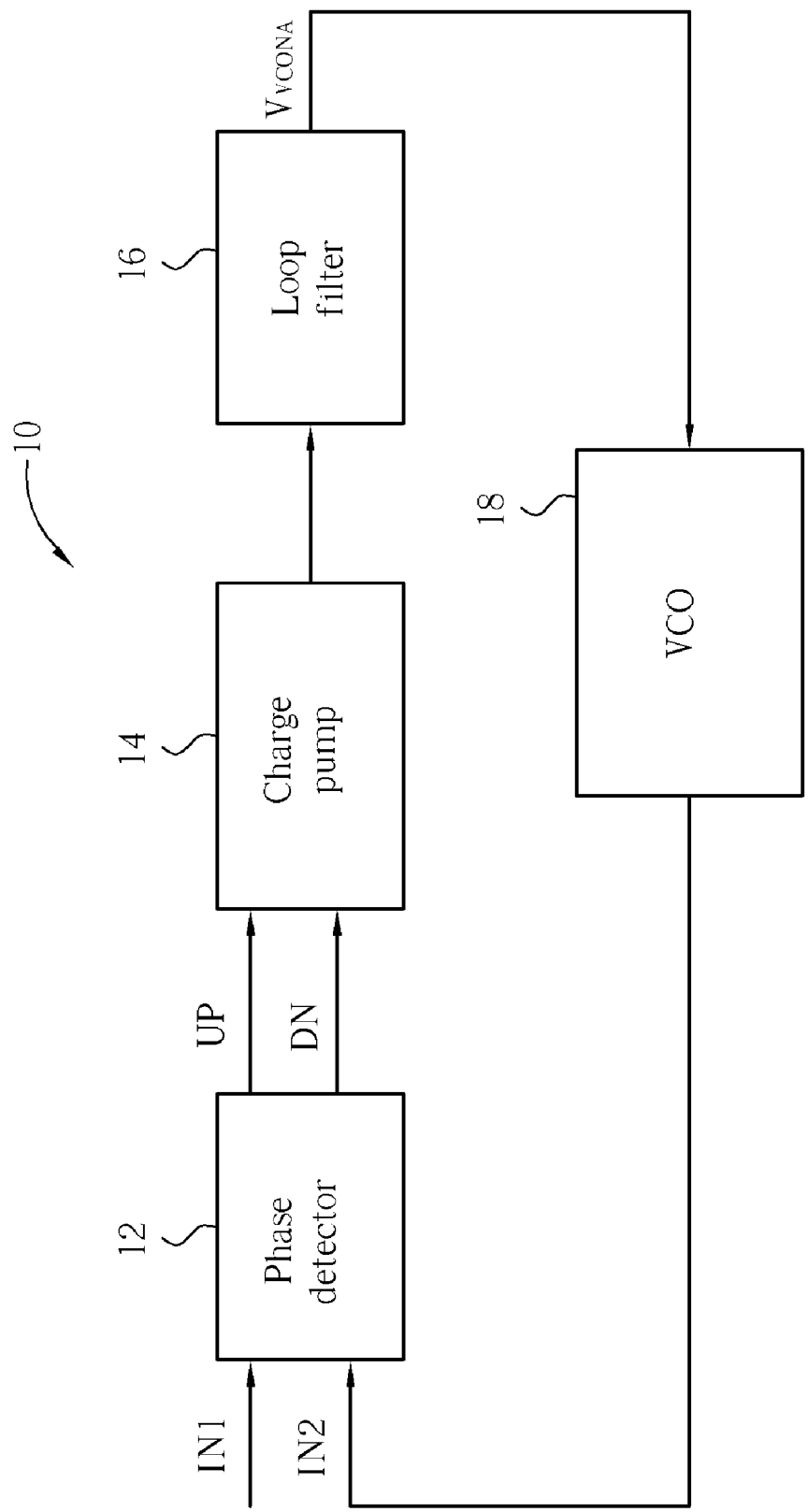
FIG. 1 is a block diagram of a phase locked loop (PLL) according to the prior art.
Figure 2A:
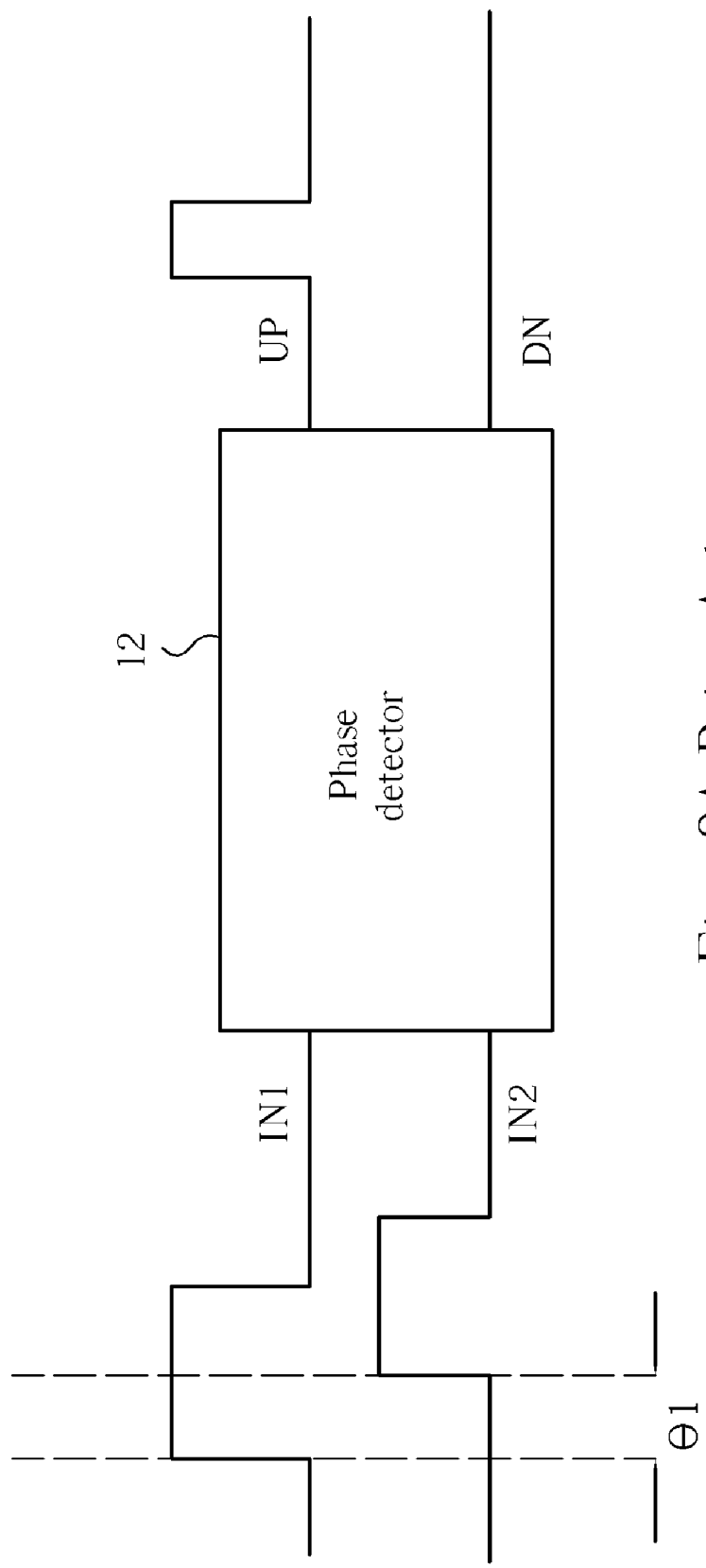
FIG. 2A is a diagram illustrating operation of a phase detector of the PLL when generating an up signal.
Figure 2B:
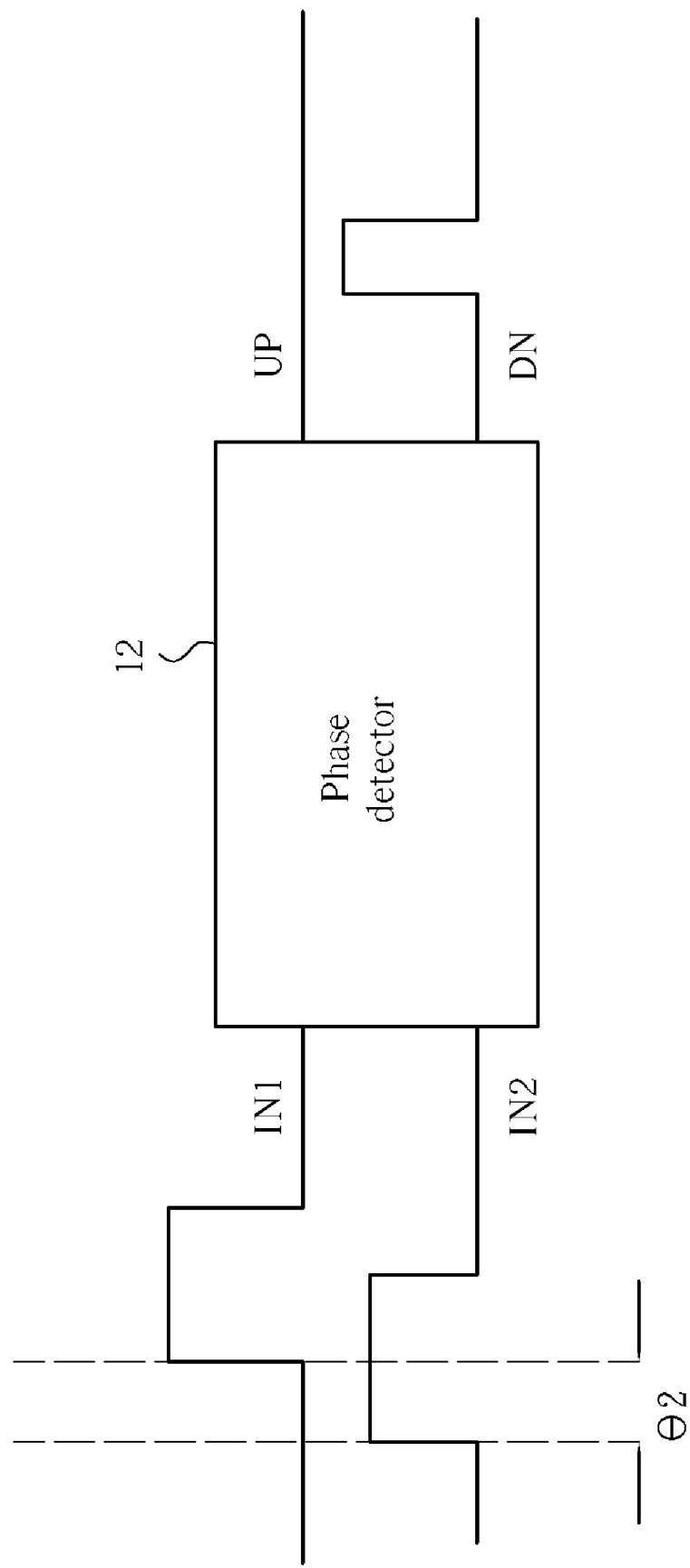
FIG. 2B is a diagram illustrating operation of the phase detector of the PLL when generating a down signal.
Figure 4A:
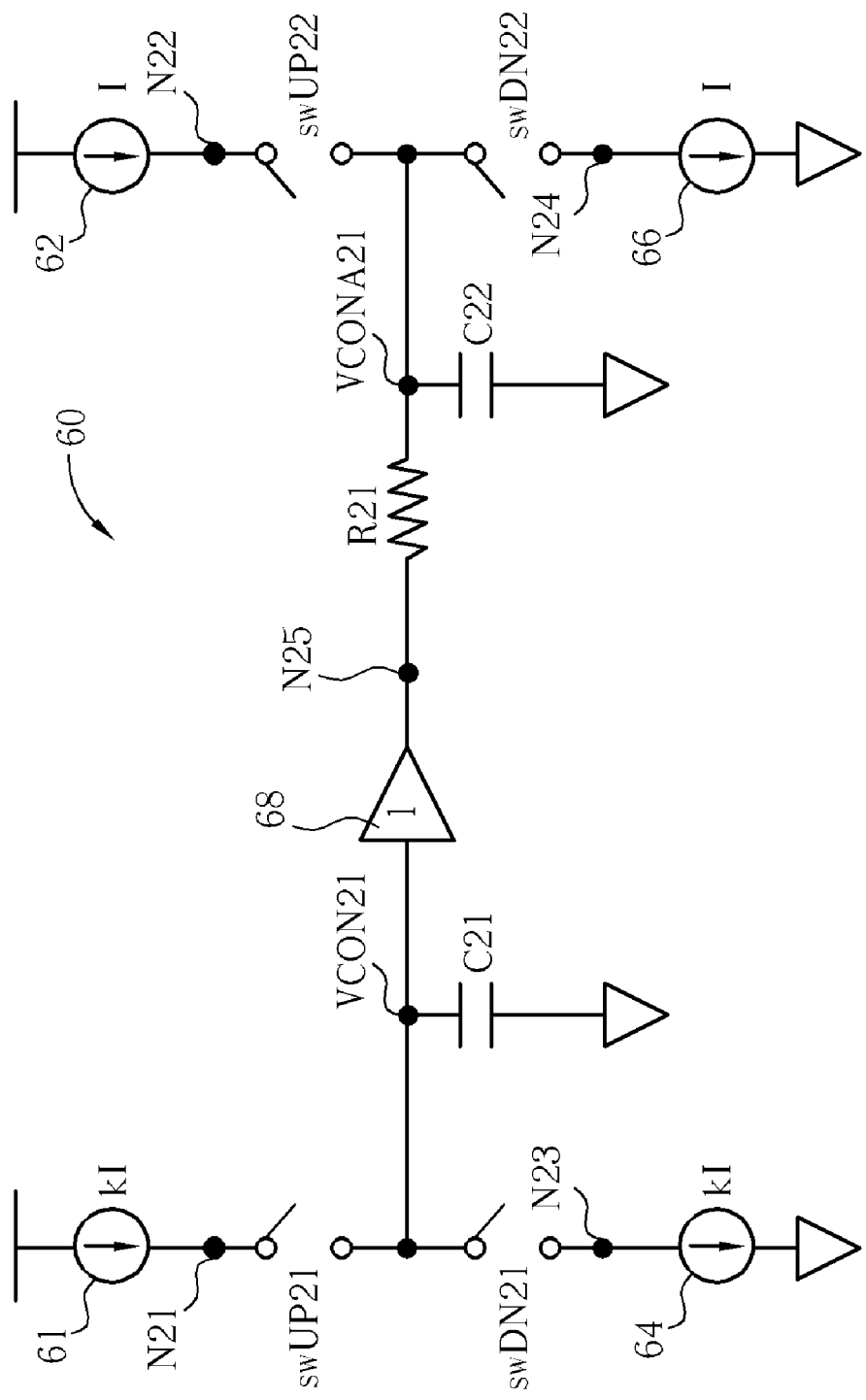
FIG. 4A is a circuit diagram of a charge pump and loop filter circuit according to a first embodiment of the present invention.

Please refer to FIG. 4A. FIG. 4A is a circuit diagram of a charge pump and loop filter circuit 60 according to a first embodiment of the present invention. The charge pump and loop filter circuit 60 of the present invention substitutes for the charge pump circuit 14 and the loop filter 16 of the prior art. The phase detector 12 and the VCO 18 shown in FIG. 1 are used just as they were with the prior art, and for brevity will not be explained again.

In the charge pump and loop filter circuit 60, a capacitor C21 is used instead of the capacitor C that was used in the loop filter 16 of the prior art. As will be explained below, a main objective of the present invention is to reduce capacitance of the capacitor C21 by reducing the amount of current that is used for charging and discharging the capacitor C21.

The charge pump and loop filter circuit 60 of the present invention contains a first input current source 61 electrically connected to a node N21 of the charge pump and loop filter circuit 60 for supplying a current with a magnitude of kI to the charge pump and loop filter circuit 60. The current kI is equal to the current I outputted by the input current source 20 of the prior art multiplied by a first factor of k. In the present invention, k can be any factor between 0 and 1. The charge pump and loop filter circuit 60 also includes a second input current source 62 electrically connected to a node N22 of the charge pump and loop filter circuit 60 for supplying a current with a magnitude of I to the charge pump and loop filter circuit 60. The current I is equal to the current I outputted by the input current source 20 of the prior art multiplied by a second factor of 1. The present invention charge pump and loop filter circuit 60 is built using two input current sources 61 and 62 in a preferred embodiment. As will be explained in greater detail later, a magnitude chosen for the first factor k determines the corresponding capacitance of the capacitor C21.

The charge pump and loop filter circuit 60 also contains a first output current source 64 electrically connected to a node N23 of the charge pump and loop filter circuit 60 for outputting the current kI from the charge pump and loop filter circuit 60. Similarly, a second output current source 66 is electrically connected to a node N24 of the charge pump and loop filter circuit 60 for outputting the current I from the charge pump and loop filter circuit 60. In this embodiment of the present invention, the current kI supplied by the first input current source 61 should be equal to the current kI received by the first output current source 64, and the current I supplied by the second input current source 62 should be equal to the current I received by the second output current source 66.

As shown in FIG. 4A, the capacitor C21 is connected between an intermediate node VCON21 of the charge pump and loop filter circuit 60 and ground. The charge pump and loop filter circuit 60 also contains a unit gain buffer 68, a resistor R21, and a capacitor C22. The unit gain buffer 68 is electrically connected between the intermediate node VCON21 and a node N25, and is used for supplying the voltage of the intermediate node VCON21 to the node N25. The unit gain buffer 68 also does not allow any current to flow from the intermediate node VCON21 to the node N25. The unit gain buffer 68 has a gain at or near unity, and can be formed by a source follower circuit, an emitter follower circuit, or an operational amplifier with direct feedback, thereby forming a voltage follower.

The resistor R21 is electrically connected between the node N25 and an output node VCONA21, and is used to improve stability in the charge pump and loop filter circuit 60. The capacitor C22 is electrically connected between the output node VCONA21 of the charge pump and loop filter circuit 60 and ground. The capacitor C22 is used as a high-order low-pass capacitor, and is optionally used to improve performance of the charge pump and loop filter circuit 60. On the other hand, the capacitor C21 is used as an integration capacitor. Since the capacitors C21 and C22 are each connected to ground, capacitors C21 and C22 can be formed as MOS capacitors. MOS capacitors can be built using much less chip area than poly capacitors or metal capacitors, which is necessary for forming floating capacitors.

Analogous to the up pulse switch swUP of the prior art charge pump circuit 14, the present invention charge pump and loop filter circuit 60 contains a first up pulse switch swUP21 and a second up pulse switch swUP22. The first up pulse switch swUP21 is connected between the node N21 and the intermediate node VCON21, and the second up pulse switch swUP22 is connected between the node N22 and the output node VCONA21. Each of the up pulse switches swUP21 and swUP22 is controlled by the up signal UP that is outputted by the phase detector 12. When a pulse from the up signal UP is received by the charge pump and loop filter circuit 60, both of the up pulse switches swUP21 and swUP22 are closed such that the charge pump and loop filter circuit 60 is in a charging mode and the capacitor C21 is charged. At all other times, the up pulse switches swUP21 and swUP22 remain open.

Also, similar to the down pulse switch swDN of the prior art charge pump circuit 14, the present invention charge pump and loop filter circuit 60 contains a first down pulse switch swDN21 and a second down pulse switch swDN22. The first down pulse switch swDN21 is connected between the intermediate node VCON21 and the node N23, and the second down pulse switch swDN22 is connected between the output node VCONA21 and the node N24. Each of the down pulse switches swDN21 and swDN22 is controlled by the down signal DN that is outputted by the phase detector 12. When a pulse from the down signal DN is received by the charge pump and loop filter circuit 60, both of the down pulse switches swDN21 and swDN22 are closed such that the charge pump and loop filter circuit 60 is in a discharging mode and the capacitor C21 is discharged. At all other times, the down pulse switches swDN21 and swDN22 remain open.

As shown in FIG. 4A, both the up pulse switches swUP21 and swUP22 and the down pulse switches swDN21 and swDN22 are shown open since neither the up signal UP nor the down signal DN are received by the charge pump and loop filter circuit 60. Therefore, no current is able to flow from any of the current sources 61, 62, 64, and 66 in order to charge or discharge the capacitor C21.

Figure 4B:
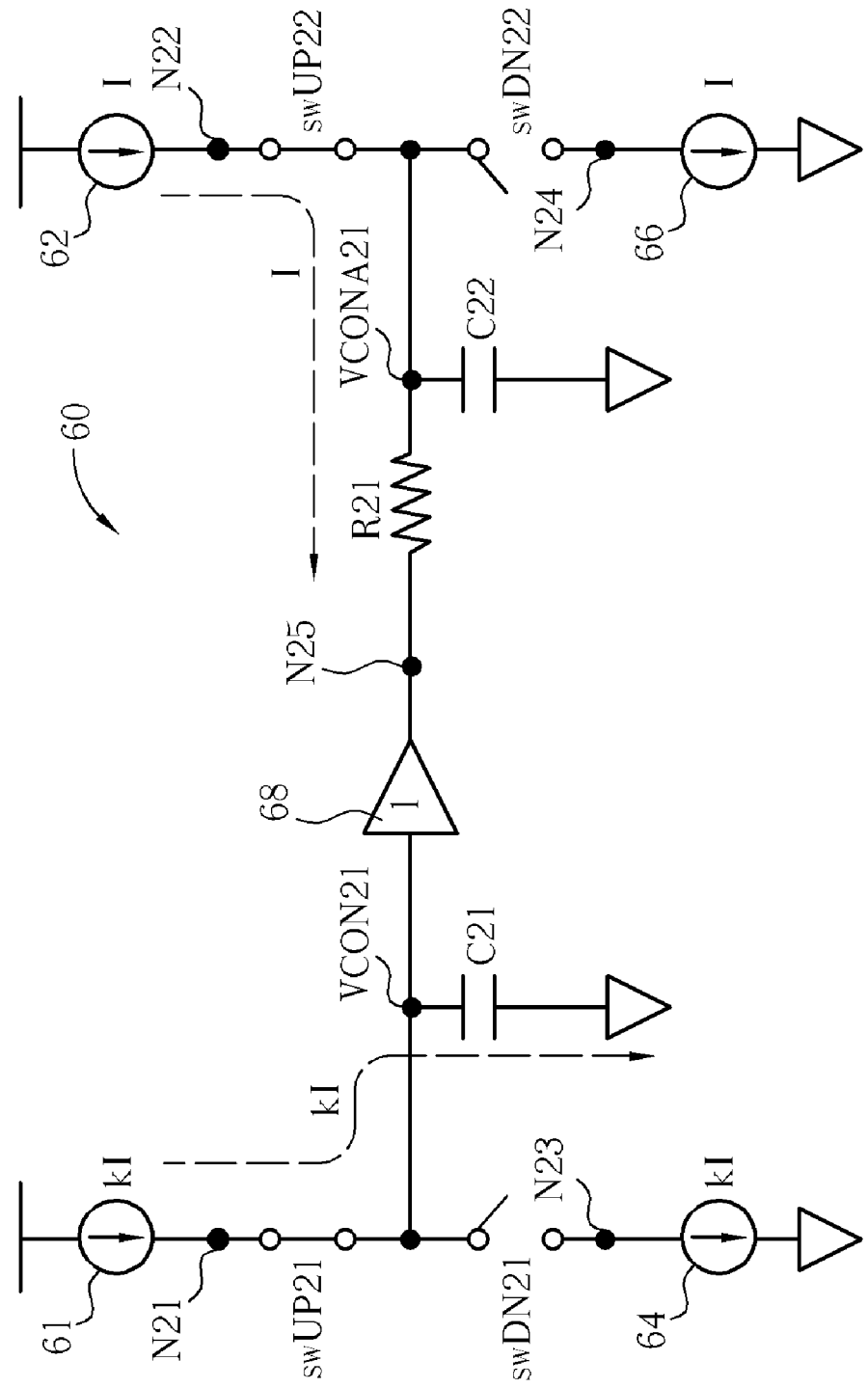
FIG. 4B is a circuit diagram of the charge pump and loop filter circuit of FIG. 4A in a charging mode.

Please refer to FIG. 4B. FIG. 4B is a circuit diagram of the charge pump and loop filter circuit 60 of FIG. 4A in the charging mode. In FIG. 4B, the charge pump and loop filter circuit 60 receives a pulse of the up signal UP from the phase detector 12. Therefore, the up pulse switches swUP21 and swUP22 are closed and the down pulse switches swDN21 and swDN22 are open.

Dotted lines are shown illustrating paths of two currents. For charging the capacitor C21, current kI from the first input current source 61 flows through the node N21, through the intermediate node VCON21, and through the capacitor C21 before flowing out through ground. The unit gain buffer 68 does not allow any of the current from the first input current source 61 to flow from the intermediate node VCON21 across the unit gain buffer 68 into the node N25. Current I from the second input current source 62 flows through the node N22, through the output node VCONA21, and through the resistor R21.

Figure 4C:
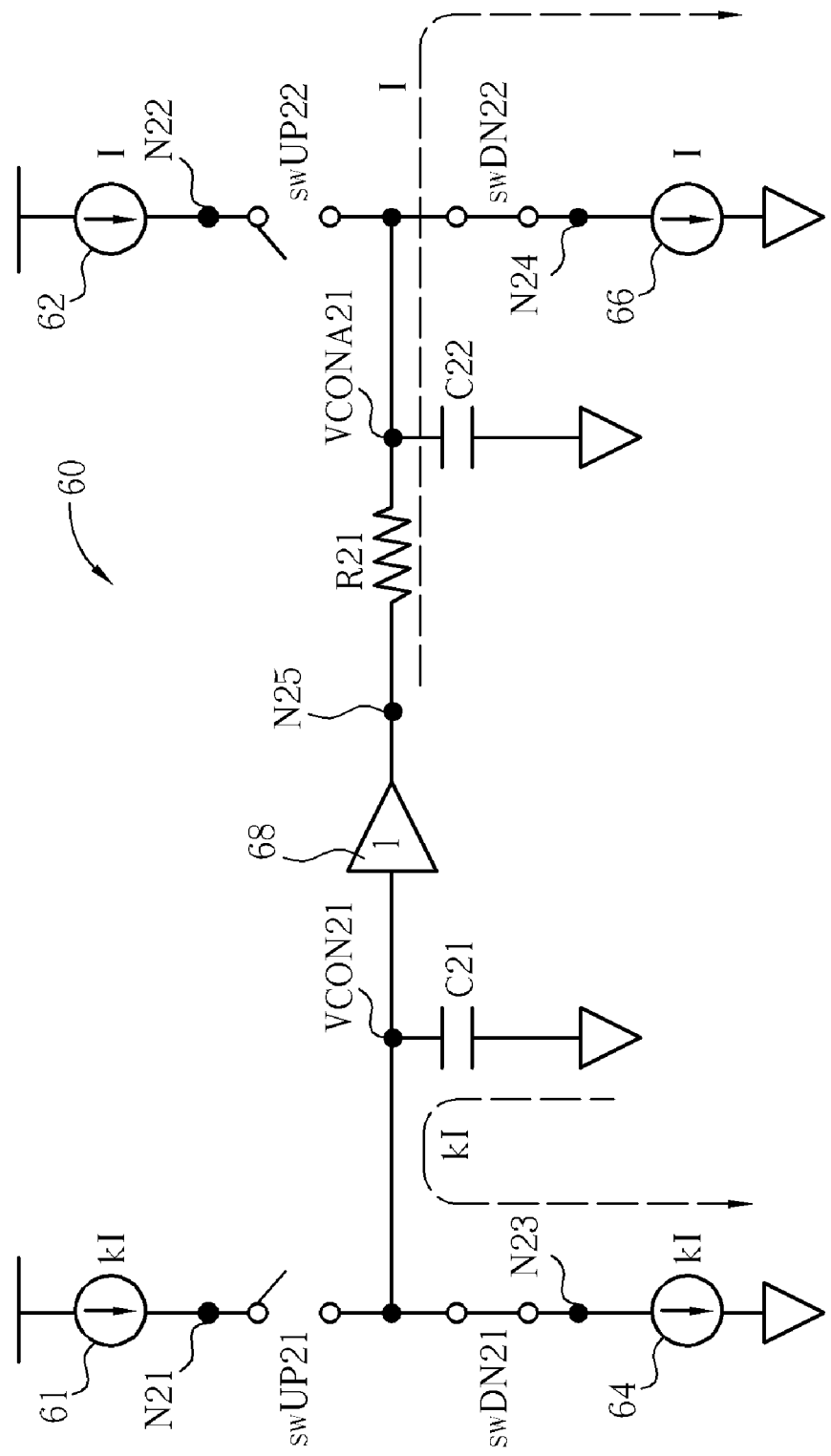
FIG. 4C is a circuit diagram of the charge pump and loop filter circuit of FIG. 4A in a discharging mode.

Please refer to FIG. 4C. FIG. 4C is a circuit diagram of the charge pump and loop filter circuit 60 of FIG. 4A in the discharging mode. In FIG. 4C, the charge pump and loop filter circuit 60 receives a pulse of the down signal DN from the phase detector 12. Therefore, the down pulse switches swDN21 and swDN22 are closed and the up pulse switches swUP21 and swUP22 are open.

Dotted lines are shown illustrating paths of two currents. For discharging the capacitor C21, current kI flows from ground, through the capacitor C21, through the intermediate node VCON21, through the node N23, and out through the second output current source 64. Again, no current flows through the unit gain buffer 68. Current I flows from the node N25 through the resistor R21, through the output node VCONA21, through the node N24, and out through the second output current source 66.

Figure 3A:
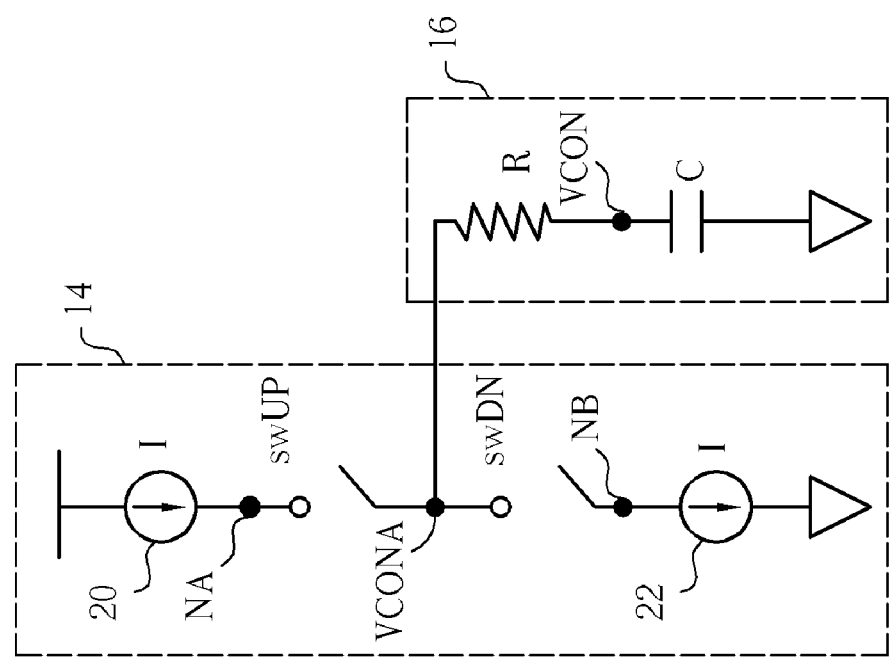
FIG. 3A is a circuit diagram of a charge pump circuit and a loop filter of the prior art.
Figure 3B:
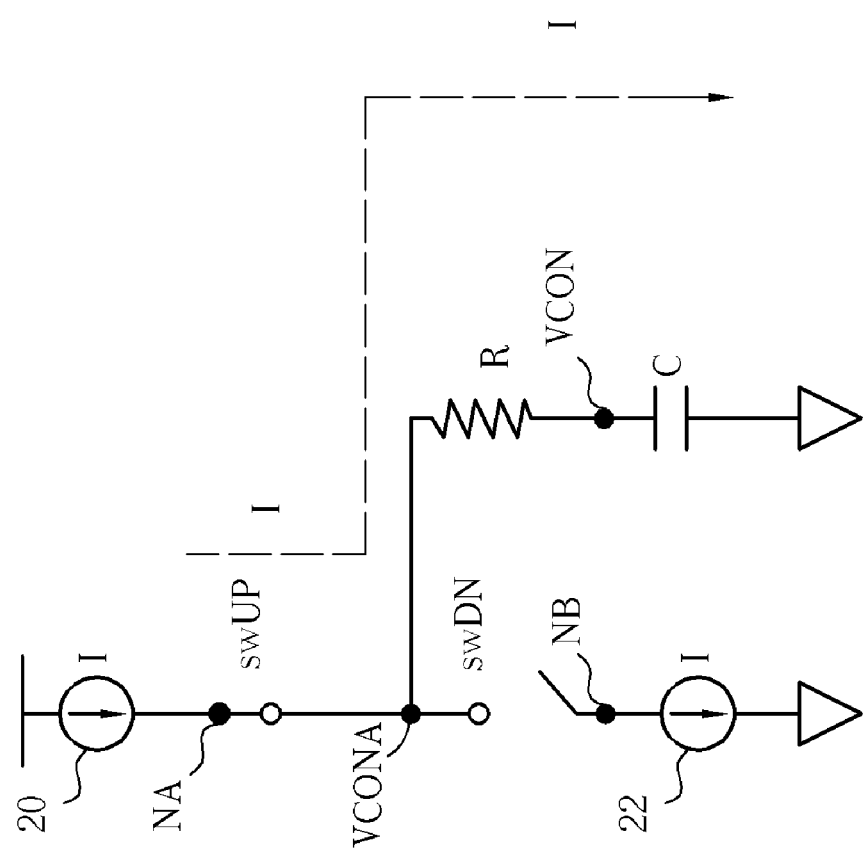
FIG. 3B is a circuit diagram of the prior art charge pump circuit and loop filter in a charging mode.

A voltage $V_{VCONA21}$ of the output node VCONA21 is outputted to the VCO 18 for controlling operation of the VCO 18. That means the charge pump and loop filter circuit 60 should be designed such that $V_{VCONA21}$ has the same behavior in the present invention as $V_{VCONA}$ did in the prior art. Referring back to Eqn.3, it is seen that $V_{VCONA}$ depends on the sum of IR and $V_{VCON}$. Please refer to FIG. 3B and FIG. 4B. In each figure, the current flowing through the resistors R and R21 has a magnitude of I. Therefore the quantity IR is the same for the prior art and the present invention. In order to see that the voltage $V_{VCON21}$ is the same in the present invention as $V_{VCON}$ of the prior art, it is helpful to look at the relationship between i and C in Eqn.1 and Eqn.2. Since i is directly proportional to C, the values of i and C can each be divided by any constant K, and Eqn.2 will still hold true. Thus, in FIG. 4B, the capacitance of capacitor C21 has a magnitude which is smaller than the capacitance of the capacitor C shown in FIG. 3B by a factor of k, k being a number between 0 and 1. Likewise, the current kI flowing through the capacitor C21 has a magnitude which is smaller than that of the current I flowing through the capacitor C in FIG. 3B by a factor of k. Upon re-examining Eqn.1, it can be concluded that since the relative sizes of i and C are exactly equal between the present invention and the prior art, the change in voltage during the charging process must be the same. Therefore, the behavior of $V_{VCON21}$ in the present invention is the same as $V_{VCON}$ of the prior art during the charging process, which means the behavior of $V_{VCONA21}$ is the same as $V_{VCONA}$ also.

Figure 3C:
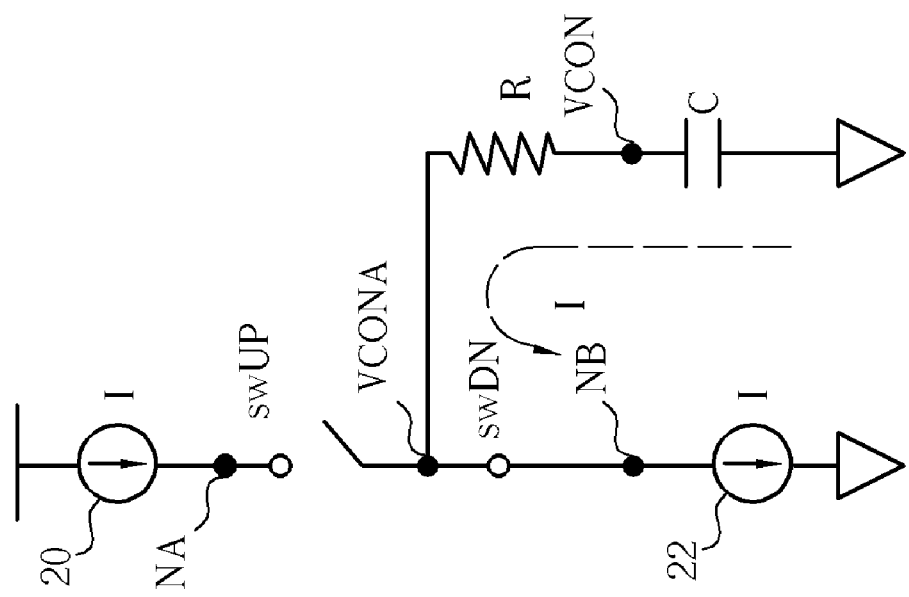
FIG. 3C is a circuit diagram of the prior art charge pump circuit and loop filter in a discharging mode.

The above explanation of the behavior of $V_{VCONA21}$ of the present invention being equal to $V_{VCONA}$ of the prior art is also true for the discharging processes shown in FIG. 3C and FIG. 4C. Only the direction of the currents flowing through capacitors C and C21 and resistors R and R21 changes, and the behavior of voltage $V_{VCONA21}$ will remain the same in the present invention as the behavior of $V_{VCONA}$ in the prior art.

Figure 5A:
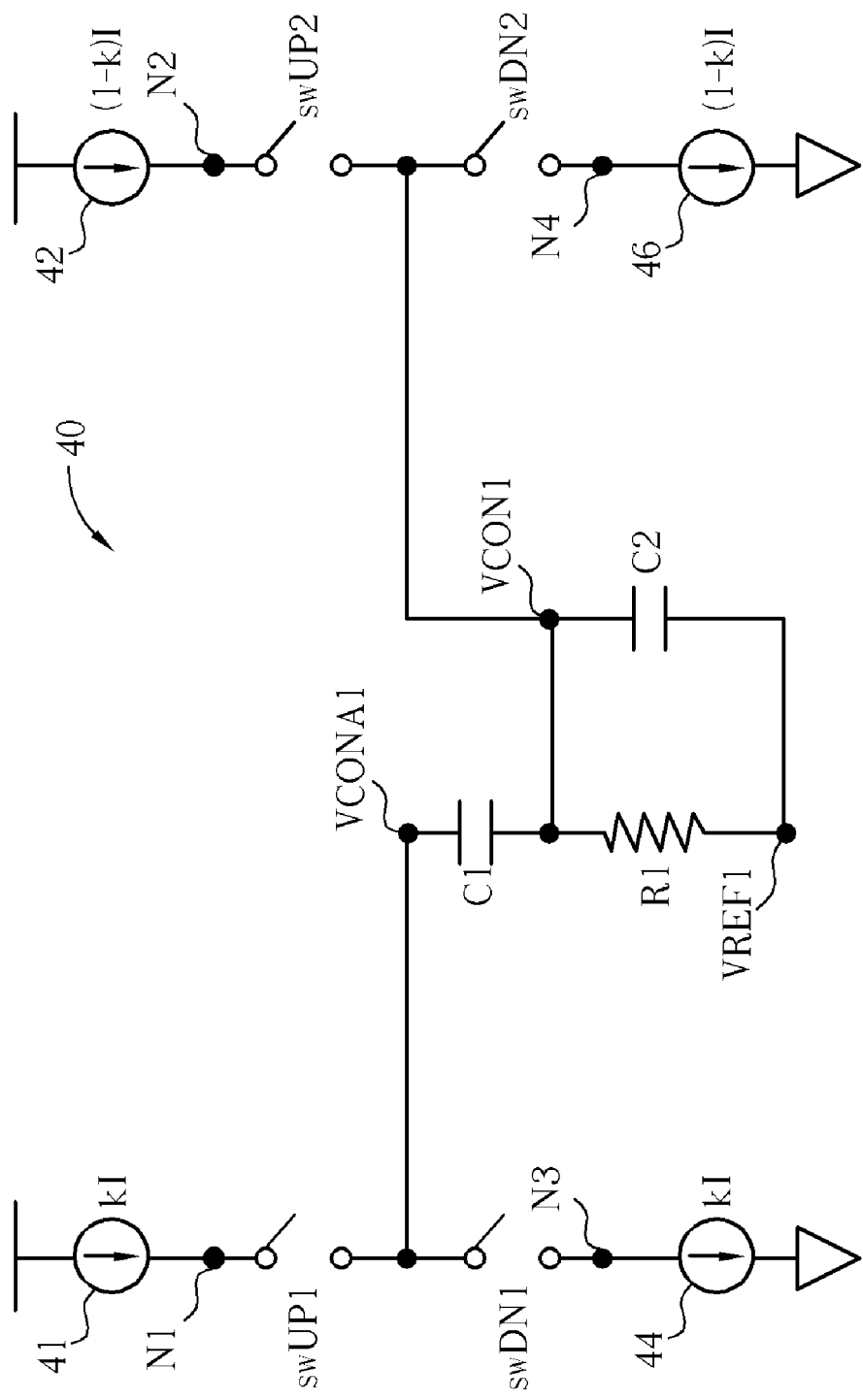
FIG. 5A is a circuit diagram of a charge pump and loop filter circuit according to a second embodiment of the present invention.

Please refer to FIG. 5A. FIG. 5A is a circuit diagram of a charge pump and loop filter circuit 40 according to a second embodiment of the present invention. In the charge pump and loop filter circuit 40, a capacitor C1 is used instead of the capacitor C that was used in the loop filter 16 of the prior art.

The charge pump and loop filter circuit 40 of the present invention contains a first input current source 41 electrically connected to a node N1 of the charge pump and loop filter circuit 40 for supplying a current with a magnitude of kI to the charge pump and loop filter circuit 40. The current kI is equal to the current I outputted by the input current source 20 of the prior art multiplied by a first factor of k, k being any factor between 0 and 1. The charge pump and loop filter circuit 40 also includes a second input current source 42 electrically connected to a node N2 of the charge pump and loop filter circuit 40 for supplying a current with a magnitude of (1-k)I to the charge pump and loop filter circuit 40. The current (1-k)I is equal to the current I outputted by the input current source 20 of the prior art multiplied by a second factor of (1-k). The present invention charge pump and loop filter circuit 40 is built using two input current sources 41 and 42. Therefore, a sum of the first and second factors k and (1-k) is shown adding up to a value of 1. This ensures that such that the sum of the currents kI and (1-k)I is consistent with the current I outputted from the prior art input current source 20. As will be explained in greater detail later, a magnitude chosen for the first factor k determines the corresponding capacitance of the capacitor C1.

The charge pump and loop filter circuit 40 also contains a first output current source 44 electrically connected to a node N3 of the charge pump and loop filter circuit 40 for outputting the current kI from the charge pump and loop filter circuit 40. Similarly, a second output current source 46 is electrically connected to a node N4 of the charge pump and loop filter circuit 40 for outputting the current (1-k)I from the charge pump and loop filter circuit 40. In this embodiment of the present invention, the current kI supplied by the first input current source 41 should be equal to the current kI received by the first output current source 44, and the current (1-k)I supplied by the second input current source 42 should be equal to the current (1-k)I received by the second output current source 46.

As shown in FIG. 5A, the capacitor C1 is connected between an output node VCONA1 and an intermediate node VCON1 of the charge pump and loop filter circuit 40. The charge pump and loop filter circuit 40 also contains a resistor R1 and a capacitor C2. The resistor R1 is electrically connected between the intermediate node VCON1 and a reference node VREF1, and is used to improve stability in the charge pump and loop filter circuit 40. The capacitor C2 is electrically connected between the intermediate node VCON1 and the reference node VREF1 of the charge pump and loop filter circuit 40. The capacitor C2 is used as a high-order low-pass capacitor, and is optionally used to improve performance of the charge pump and loop filter circuit 40. On the other hand, the capacitor C1 is used as an integration capacitor. Since the capacitors C1 and C2 are not connected to ground, capacitors C1 and C2 are considered floating capacitors, and can be formed as poly capacitors or metal capacitors.

Analogous to the up pulse switch swUP of the prior art charge pump circuit 14, the present invention charge pump and loop filter circuit 40 contains a first up pulse switch swUP1 and a second up pulse switch swUP2. The first up pulse switch swUP1 is connected between the node N1 and the output node VCONA1, and the second up pulse switch swUP2 is connected between the node N2 and the intermediate node VCON1. Each of the up pulse switches swUP1 and swUP2 is controlled by the up signal UP that is outputted by the phase detector 12. When a pulse from the up signal UP is received by the charge pump and loop filter circuit 40, both of the up pulse switches swUP1 and swUP2 are closed such that the charge pump and loop filter circuit 40 is in a charging mode and the capacitor C1 is charged. At all other times, the up pulse switches swUP1 and swUP2 remain open.

Also, similar to the down pulse switch swDN of the prior art charge pump circuit 14, the present invention charge pump and loop filter circuit 40 contains a first down pulse switch swDN1 and a second down pulse switch swDN2. The first down pulse switch swDN1 is connected between the output node VCONA1 and the node N3, and the second down pulse switch swDN2 is connected between the intermediate node VCON1 and the node N4. Each of the down pulse switches swDN1 and swDN2 is controlled by the down signal DN that is outputted by the phase detector 12. When a pulse from the down signal DN is received by the charge pump and loop filter circuit 40, both of the down pulse switches swDN1 and swDN2 are closed such that the charge pump and loop filter circuit 40 is in a discharging mode and the capacitor C1 is discharged. At all other times, the down pulse switches swDN1 and swDN2 remain open.

As shown in FIG. 5A, both the up pulse switches swUP1 and swUP2 and the down pulse switches swDN1 and swDN2 are shown open since neither the up signal UP nor the down signal DN are received by the charge pump and loop filter circuit 40. Therefore, no current is able to flow from any of the current sources 41, 42, 44, and 46 in order to charge or discharge the capacitor C1.

Figure 5B:
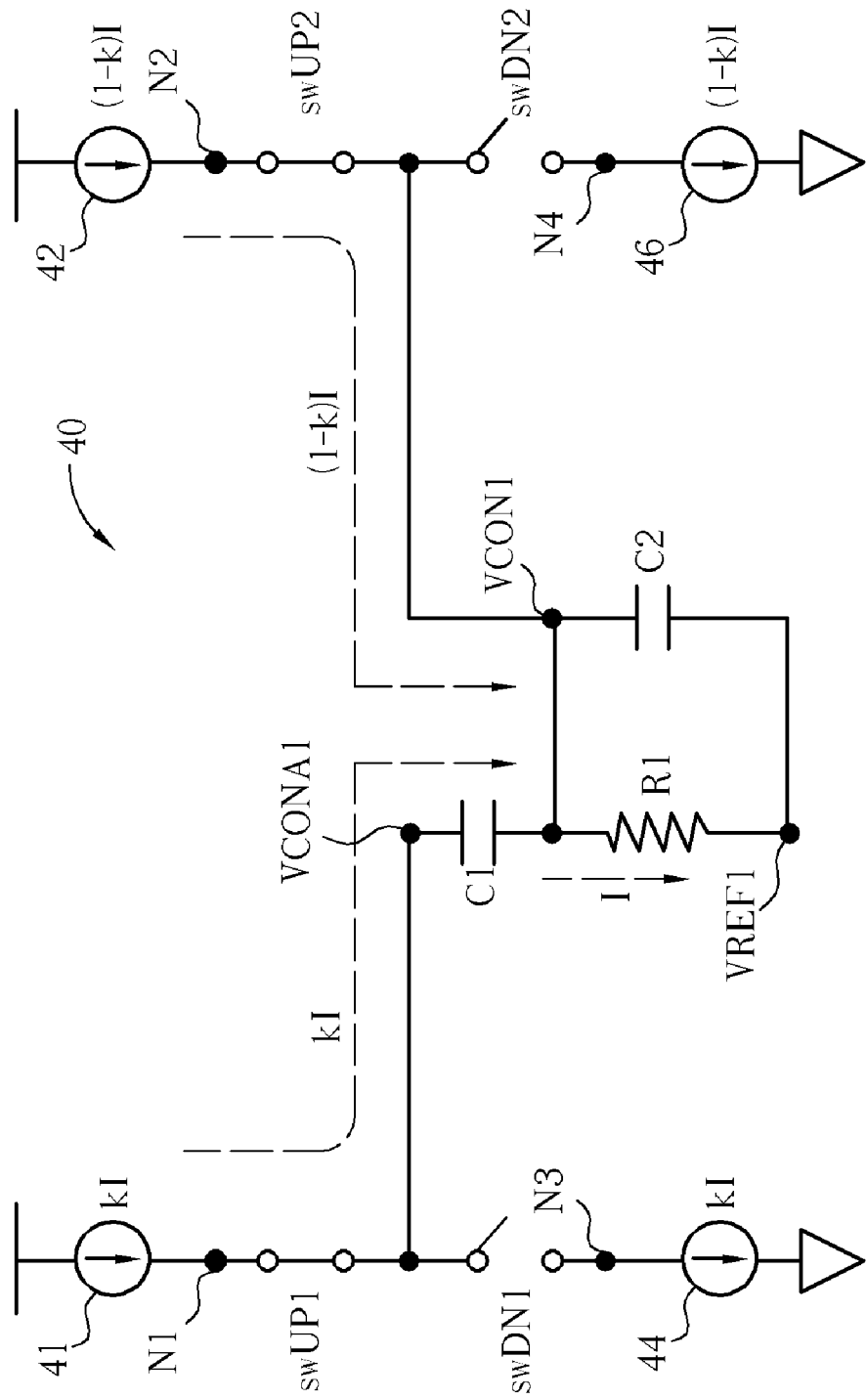
FIG. 5B is a circuit diagram of the charge pump and loop filter circuit of FIG. 5A in the charging mode.

Please refer to FIG. 5B. FIG. 5B is a circuit diagram of the charge pump and loop filter circuit 40 of FIG. 5A in the charging mode. In FIG. 5B, the charge pump and loop filter circuit 40 receives a pulse of the up signal UP from the phase detector 12. Therefore, the up pulse switches swUP1 and swUP2 are closed and the down pulse switches swDN1 and swDN2 are open.

Dotted lines are shown illustrating paths of three currents. For charging the capacitor C1, current kI from the first input current source 41 flows through the node N1, through the output node VCONA1, and through the capacitor C1 to the intermediate node VCON1. Current (1-k)I from the second input current source 42 flows through the node N2 to the intermediate node VCON1. A sum of the currents kI and (1-k)I then flows from the intermediate node VCON1, through the resistor R1, and out through the reference node VREF1 so that a total current I flows through the resistor R1.

Figure 5C:
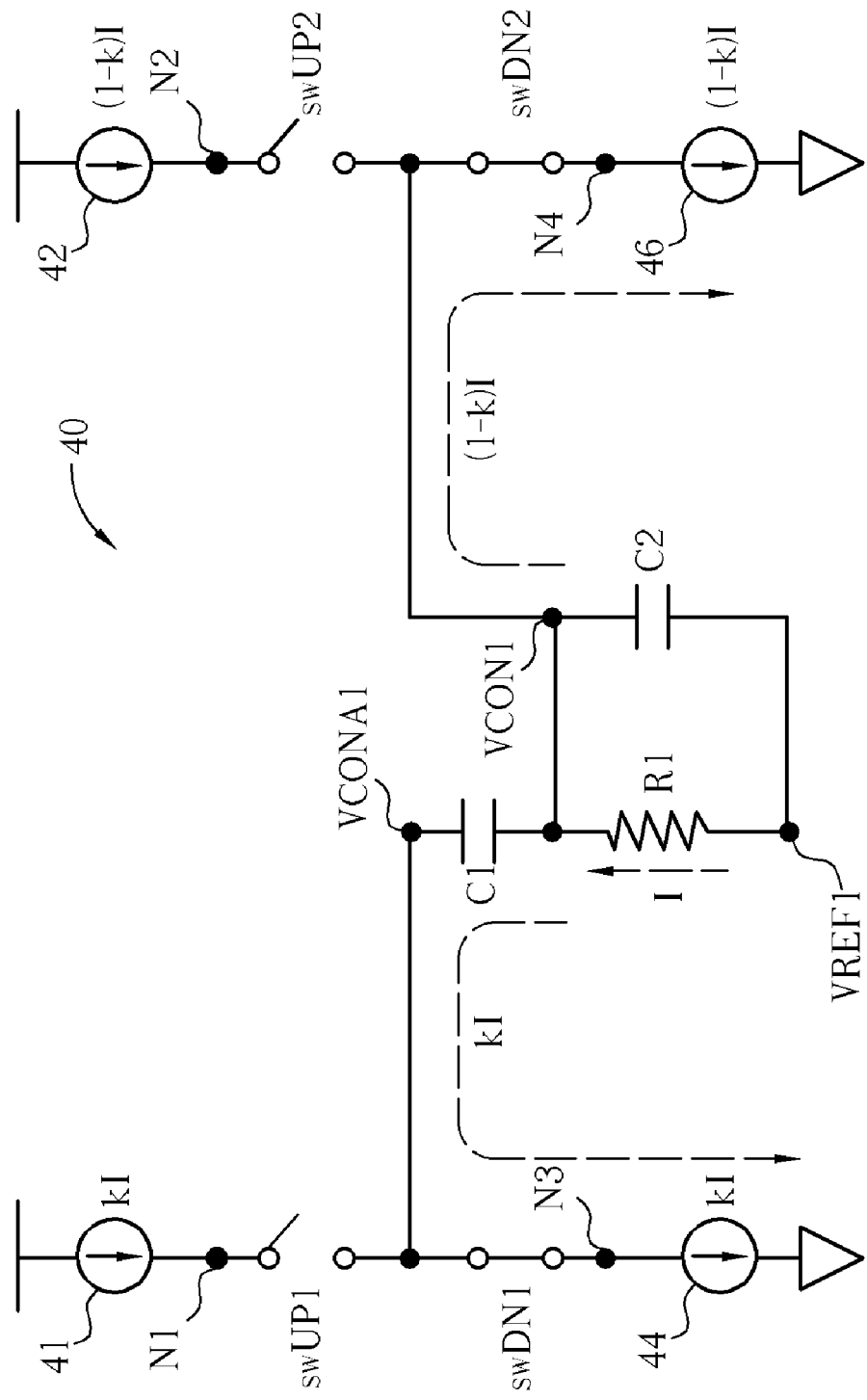
FIG. 5C is a circuit diagram of the charge pump and loop filter circuit of FIG. 5A in the discharging mode.

Please refer to FIG. 5C. FIG. 5C is a circuit diagram of the charge pump and loop filter circuit 40 of FIG. 5A in the discharging mode. In FIG. 5C, the charge pump and loop filter circuit 40 receives a pulse of the down signal DN from the phase detector 12. Therefore, the down pulse switches swDN1 and swDN2 are closed and the up pulse switches swUP1 and swUP2 are open.

Dotted lines are shown illustrating paths of three currents. A sum of the currents kI and (1-k)I flows from the reference node VREF1 through the resistor R1 to the intermediate node VCON1 so that a total current I flows through the resistor R1. For discharging the capacitor C1, current kI flows from the intermediate node VCON1, through the capacitor C1, through the output node VCONA1, through the node N3, and out through the second output current source 44. Current (1-k)I flows from the intermediate node VCON1, through the node N4, and out through the second output current source 46.

A voltage $V_{VCONA1}$ of the output node VCONA1 is outputted to the VCO 18 for controlling operation of the VCO 18. That means the charge pump and loop filter circuit 40 should be designed such that $V_{VCONA1}$ has the same behavior in the present invention as $V_{VCONA}$ did in the prior art. Referring back to Eqn.3, it is seen that $V_{VCONA}$ depends on the sum of IR and $V_{VCON}$. Please refer to FIG. 3B and FIG. 5B. In each figure, the current flowing through the resistors R and R1 has a magnitude of I. Therefore the quantity IR is the same for the prior art and the present invention. In order to see that the voltage $V_{VCON1}$ is the same in the present invention as $V_{VCON}$ of the prior art, it is helpful to look at the relationship between i and C in Eqn.1 and Eqn.2. Since i is directly proportional to C, the values of i and C can each be divided by any constant K, and Eqn.2 will still hold true. Thus, in FIG. 5B, the capacitance of capacitor C1 has a magnitude which is smaller than the capacitance of the capacitor C shown in FIG. 3B by a factor of k, k being a number between 0 and 1. Likewise, the current kI flowing through the capacitor C1 has a magnitude which is smaller than that of the current I flowing through the capacitor C in FIG. 3B by a factor of k. Upon re-examining Eqn.1, it can be concluded that since the relative sizes of i and C are exactly equal between the present invention and the prior art, the change in voltage during the charging process must be the same. Therefore, the behavior of $V_{VCON1}$ in the present invention is the same as $V_{VCON}$ of the prior art during the charging process, which means the behavior of $V_{VCONA1}$ is the same as $V_{VCONA}$ also.

The above explanation of the behavior of $V_{VCONA1}$ of the present invention being equal to $V_{VCONA}$ of the prior art is also true for the discharging processes shown in FIG. 3C and FIG. 5C. Only the direction of the currents flowing through capacitors C and C1 and resistors R and R1 changes, and the behavior of voltage $V_{VCONA1}$ will remain the same in the present invention as the behavior of $V_{VCONA}$ in the prior art.

Figure 6A:
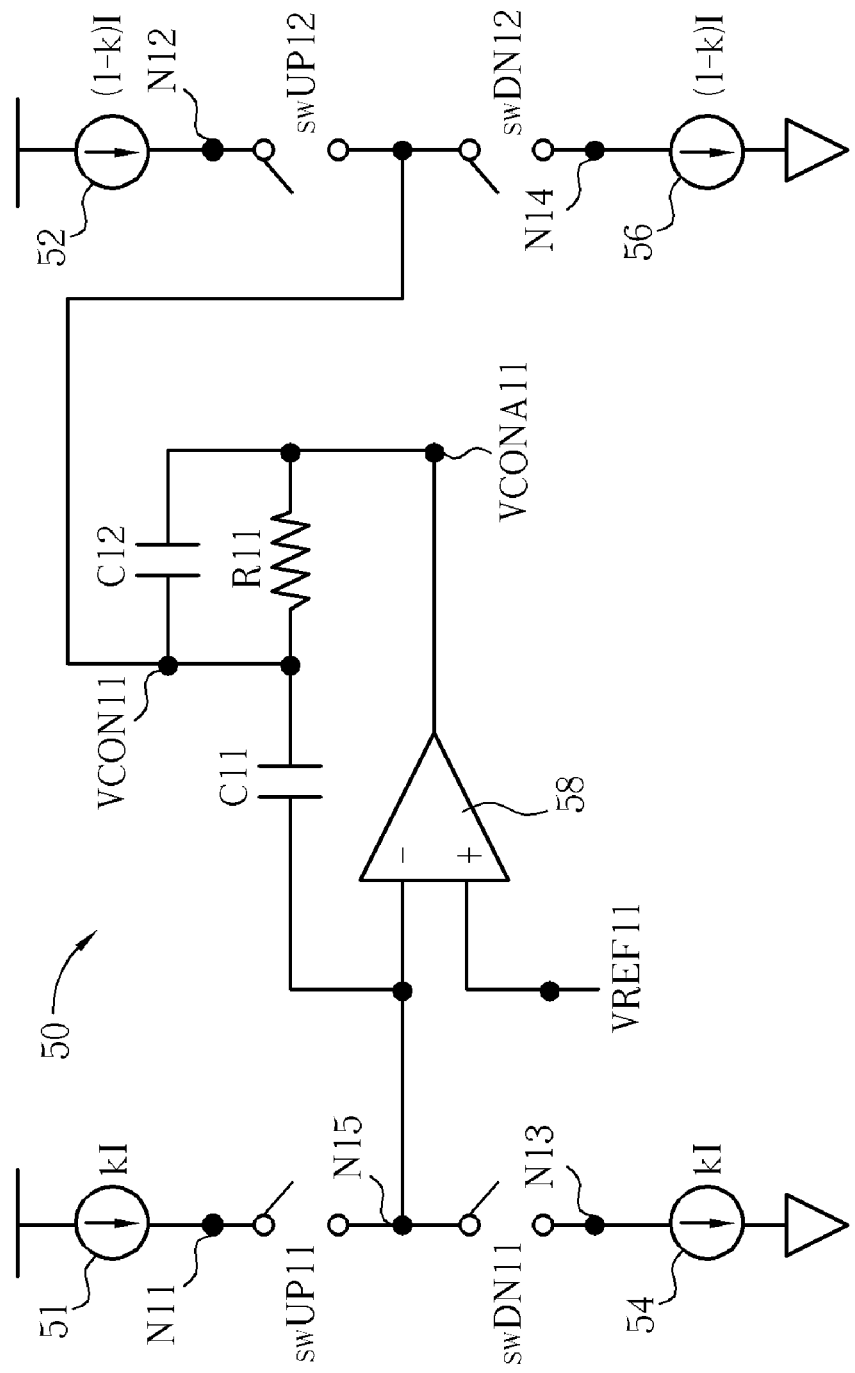
FIG. 6A is a circuit diagram of a charge pump and loop filter circuit according to a third embodiment of the present invention.

Please refer to FIG. 6A. FIG. 6A is a circuit diagram of a charge pump and loop filter circuit 50 according to a third embodiment of the present invention. In the charge pump and loop filter circuit 50, a capacitor C11 is used instead of the capacitor C that was used in the loop filter 16 of the prior art.

The charge pump and loop filter circuit 50 of the present invention contains a first input current source 51 electrically connected to a node N11 of the charge pump and loop filter circuit 50 for supplying a current with a magnitude of kI to the charge pump and loop filter circuit 50. The current kI is equal to the current I outputted by the input current source 20 of the prior art multiplied by a first factor of k, k being any factor between 0 and 1. The charge pump and loop filter circuit 50 also includes a second input current source 52 electrically connected to a node N12 of the charge pump and loop filter circuit 50 for supplying a current with a magnitude of (1-k)I to the charge pump and loop filter circuit 50. The current (1-k)I is equal to the current I outputted by the input current source 20 of the prior art multiplied by a second factor of (1-k). The present invention charge pump and loop filter circuit 50 is built using two input current sources 51 and 52. Therefore, a sum of the first and second factors k and (1-k) is shown adding up to a value of 1. This ensures that such that the sum of the currents kI and (1-k)I is consistent with the current I outputted from the prior art input current source 20. As will be explained in greater detail later, a magnitude chosen for the first factor k determines the corresponding capacitance of the capacitor C11.

The charge pump and loop filter circuit 50 also contains a first output current source 54 electrically connected to a node N13 of the charge pump and loop filter circuit 50 for outputting the current kI from the charge pump and loop filter circuit 50. Similarly, a second output current source 56 is electrically connected to a node N14 of the charge pump and loop filter circuit 50 for outputting the current (1-k)I from the charge pump and loop filter circuit 50. In this embodiment of the present invention, the current kI supplied by the first input current source 51 should be equal to the current kI received by the first output current source 54, and the current (1-k)I supplied by the second input current source 52 should be equal to the current (1-k)I received by the second output current source 56.

As shown in FIG. 6A, the capacitor C11 is connected between a node N15 and an intermediate node VCON11 of the charge pump and loop filter circuit 50. The charge pump and loop filter circuit 50 also contains an operational amplifier 58, a resistor R11, and a capacitor C12. The operational amplifier 58 has an inverting input connected to the node 15, a non-inverting input connected to a reference node VREF11, and an output connected to an output node VCONA11. The operational amplifier 58 is used to prevent current from traveling from the node N15 into the output node VCONA11, and for making node N15 and the reference node VREF11 have substantially equal voltages.

The resistor R11 is electrically connected between the intermediate node VCON11 and the output node VCONA11, and is used to improve stability in the charge pump and loop filter circuit 50. The capacitor C12 is electrically connected between the intermediate node VCON11 and the output node VCONA11 of the charge pump and loop filter circuit 50. The capacitor C12 is used as a high-order low-pass capacitor, and is optionally used to improve performance of the charge pump and loop filter circuit 50. On the other hand, the capacitor C11 is used as an integration capacitor. Since the capacitors C11 and C12 are not connected to ground, capacitors C11 and C12 are considered floating capacitors, and can be formed as poly capacitors or metal capacitors.

Analogous to the up pulse switch swUP of the prior art charge pump circuit 14, the present invention charge pump and loop filter circuit 50 contains a first up pulse switch swUP11 and a second up pulse switch swUP12. The first up pulse switch swUP11 is connected between the node N11 and the node N15, and the second up pulse switch swUP12 is connected between the node N12 and the intermediate node VCON11. Each of the up pulse switches swUP11 and swUP12 is controlled by the up signal UP that is outputted by the phase detector 12. When a pulse from the up signal UP is received by the charge pump and loop filter circuit 50, both of the up pulse switches swUP11 and swUP12 are closed such that the charge pump and loop filter circuit 50 is in a charging mode and the capacitor C11 is charged. At all other times, the up pulse switches swUP11 and swUP12 remain open.

Also, similar to the down pulse switch swDN of the prior art charge pump circuit 14, the present invention charge pump and loop filter circuit 50 contains a first down pulse switch swDN11 and a second down pulse switch swDN12. The first down pulse switch swDN11 is connected between the node N15 and the node N13, and the second down pulse switch swDN12 is connected between the intermediate node VCON11 and the node N14. Each of the down pulse switches swDN11 and swDN12 is controlled by the down signal DN that is outputted by the phase detector 12. When a pulse from the down signal DN is received by the charge pump and loop filter circuit 50, both of the down pulse switches swDN11 and swDN12 are closed such that the charge pump and loop filter circuit 50 is in a discharging mode and the capacitor C11 is discharged. At all other times, the down pulse switches swDN11 and swDN12 remain open.

As shown in FIG. 6A, both the up pulse switches swUP11 and swUP12 and the down pulse switches swDN11 and swDN12 are shown open since neither the up signal UP nor the down signal DN are received by the charge pump and loop filter circuit 50. Therefore, no current is able to flow from any of the current sources 51, 52, 54, and 56 in order to charge or discharge the capacitor C11.

Figure 6B:
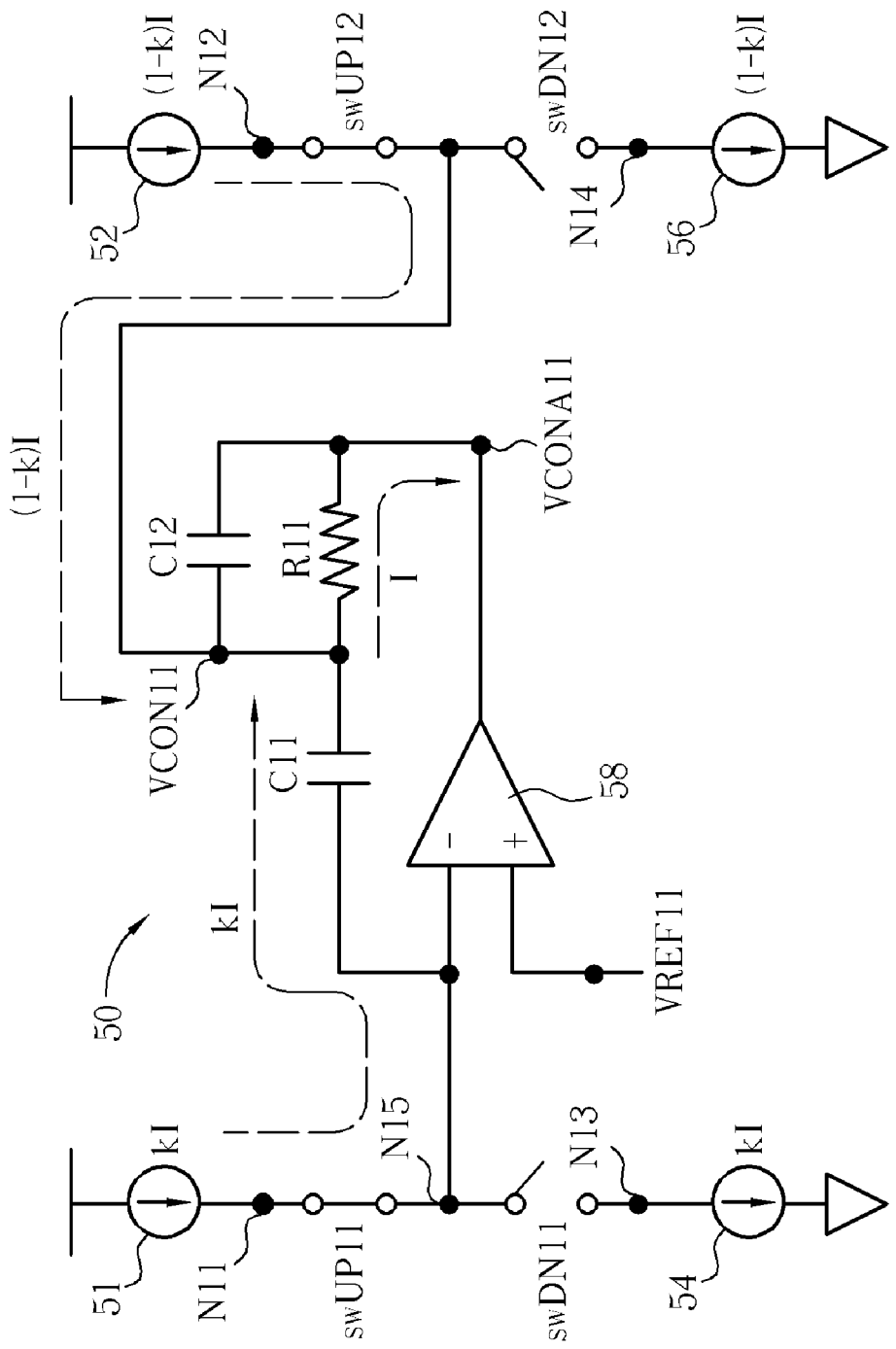
FIG. 6B is a circuit diagram of the charge pump and loop filter circuit of FIG. 6A in the charging mode.

Please refer to FIG. 6B. FIG. 6B is a circuit diagram of the charge pump and loop filter circuit 50 of FIG. 6A in the charging mode. In FIG. 6B, the charge pump and loop filter circuit 50 receives a pulse of the up signal UP from the phase detector 12. Therefore, the up pulse switches swUP11 and swUP12 are closed and the down pulse switches swDN11 and swDN12 are open.

Dotted lines are shown illustrating paths of three currents. For charging the capacitor C11, current kI from the first input current source 51 flows through the node N11, through the node N15, and through the capacitor C11 to the intermediate node VCON11. The operational amplifier 58 does not allow any of the current from the first input current source 51 to flow from the node N15 directly into the output node VCONA11. Current (1-k)I from the second input current source 52 flows through the node N12 to the intermediate node VCON11. A sum of the currents kI and (1-k)I then flows from the intermediate node VCON11, through the resistor R11, and out through the output node VCONA11 so that a total current I flows through the resistor R11.

Figure 6C:
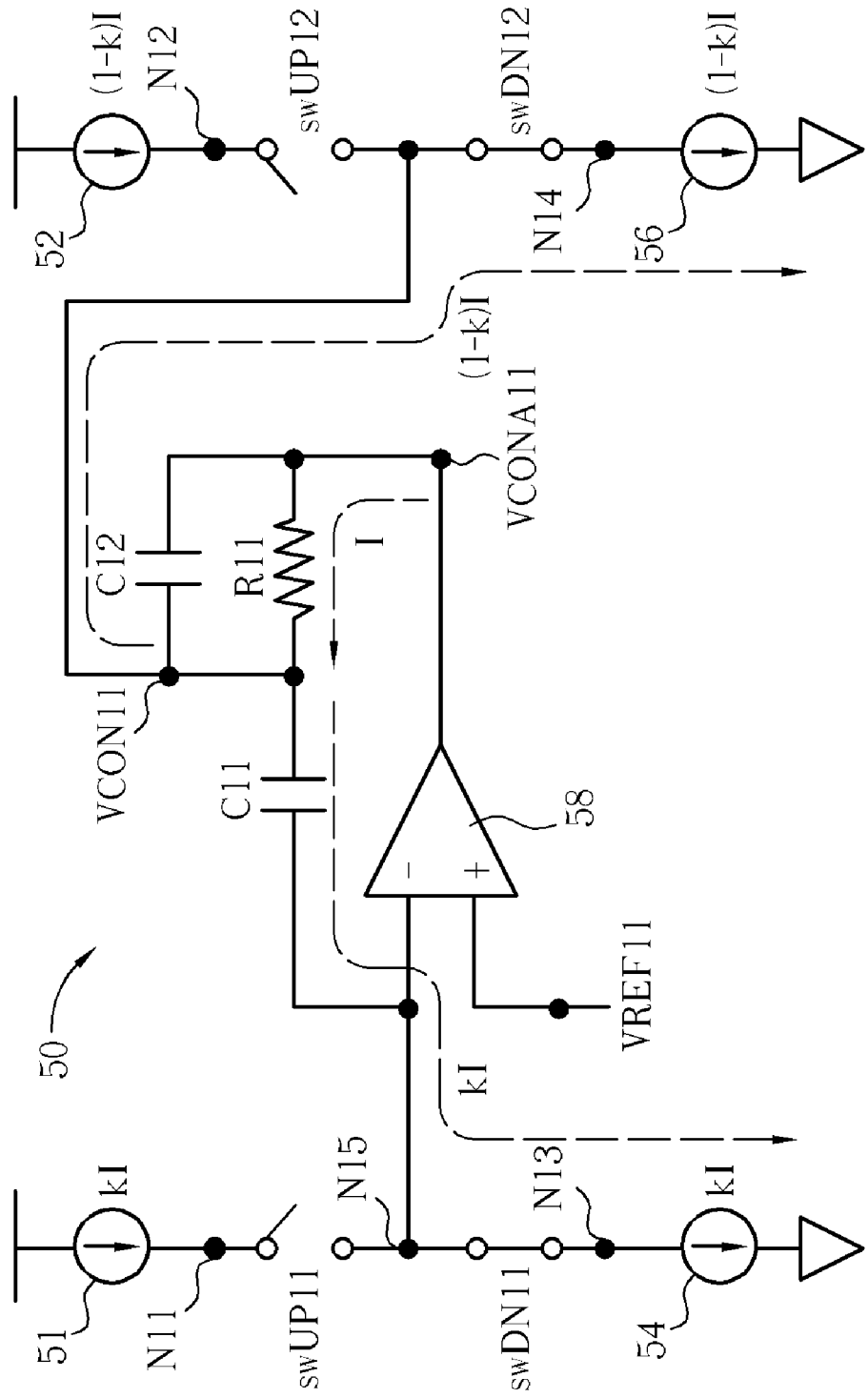
FIG. 6C is a circuit diagram of the charge pump and loop filter circuit of FIG. 6A in the discharging mode.

Please refer to FIG. 6C. FIG. 6C is a circuit diagram of the charge pump and loop filter circuit 50 of FIG. 6A in the discharging mode. In FIG. 6C, the charge pump and loop filter circuit 50 receives a pulse of the down signal DN from the phase detector 12. Therefore, the down pulse switches swDN11 and swDN12 are closed and the up pulse switches swUP11 and swUP12 are open.

Dotted lines are shown illustrating paths of three currents. A sum of the currents kI and (1-k)I flows from the output node VCONA11 through the resistor R11 to the intermediate node VCON11 so that a total current I flows through the resistor R11. For discharging the capacitor C11, current kI flows from the intermediate node VCON11, through the capacitor C11, through the node N15, through the node N13, and out through the second output current source 54. Current (1-k)I flows from the intermediate node VCON11, through the node N14, and out through the second output current source 56.

A voltage $V_{VCONA11}$ of the output node VCONA11 is outputted to the VCO 18 for controlling operation of the VCO 18. That means the charge pump and loop filter circuit 50 should be designed such that $V_{VCONA11}$ has the same behavior in the present invention as $V_{VCONA}$ did in the prior art. Referring back to Eqn.3, it is seen that $V_{VCONA}$ depends on the sum of IR and $V_{VCON}$. Please refer to FIG. 3B and FIG. 6B. In each figure, the current flowing through the resistors R and R11 has a magnitude of I. Therefore the quantity IR is the same for the prior art and the present invention. In order to see that the voltage $V_{VCON11}$ is the same in the present invention as $V_{VCON}$ of the prior art, it is helpful to look at the relationship between Iand C in Eqn.1 and Eqn.2. Since i is directly proportional to C, the values of i and C can each be divided by any constant K, and Eqn.2 will still hold true. Thus, in FIG. 6B, the capacitance of capacitor C11 has a magnitude which is smaller than the capacitance of the capacitor C shown in FIG. 3B by a factor of k, k being a number between 0 and 1. Likewise, the current kI flowing through the capacitor C11 has a magnitude which is smaller than that of the current I flowing through the capacitor C in FIG. 3B by a factor of k. Upon re-examining Eqn.1, it can be concluded that since the relative sizes of i and C are exactly equal between the present invention and the prior art, the change in voltage during the charging process must be the same. Therefore, the behavior of $V_{VCON11}$ in the present invention is the same as $V_{VCON}$ of the prior art during the charging process, which means the behavior of $V_{VCONA11}$ is the same as $V_{VCONA}$ also.

The above explanation of the behavior of $V_{VCONA11}$ of the present invention being equal to $V_{VCONA}$ of the prior art is also true for the discharging processes shown in FIG. 3C and FIG. 6C. Only the direction of the currents flowing through capacitors C and C11 and resistors R and R11 changes, and the behavior of voltage $V_{VCONA11}$ will remain the same in the present invention as the behavior of $V_{VCONA}$ in the prior art.

The present invention allows smaller first capacitors to be used to replace the capacitor of the loop filter of the prior art. The first capacitor is reduced by a factor of k, and still maintains identical behavior of the output voltage that is fed into the VCO. In the charge pump and loop filter circuit of the present invention, the up pulse switches and the down pulse switches may be formed using transistors such as MOS transistors or by any other circuitry that acts as a switch.

Compared to the prior art charge pump circuit, the charge pump and loop filter circuit of the present invention uses two input current sources that input different magnitudes of current, two output current sources that output different magnitudes of current, and several up pulse switches and down pulse switches. By using the switches to control the current flow to and from the current sources, the charge pump and loop filter circuit ensures that the amount of current that flows through the first capacitor is only a fraction of the current that flows through the resistor. This property of the charge pump and loop filter circuit allows the first capacitor to be a fraction of the size of the capacitor in the prior art loop filter. When forming the present invention charge pump and loop filter circuit on an integrated circuit, the first capacitor will take up considerably less area on the IC than was the case with the prior art. Thus, the present invention will make it easier to design and build smaller ICs that incorporate a PLL.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A charge pump and loop filter circuit of a phase locked loop, comprising:
   a first input current source electrically connected to a first node of the circuit for supplying a first current to the circuit, the first current being equal to a predetermined amount of current multiplied by a first factor;
   a second input current source electrically connected to a second node of the circuit for supplying a second current to the circuit, the second current being equal to the predetermined amount of current multiplied by a second factor;
   a first output current source electrically connected to a third node of the circuit for outputting the first current from the circuit;
   a second output current source electrically connected to a fourth node of the circuit for outputting the second current from the circuit;
   a unit gain buffer electrically connected between an intermediate node of the circuit and a fifth node of the circuit for supplying a voltage of the intermediate node to the fifth node;
   a first capacitor electrically connected between the intermediate node and a reference level of the circuit;
   a resistor electrically connected between the fifth node and an output node of the circuit;
   a second capacitor electrically connected between the output node of the circuit and the reference level;
   a plurality of up pulse switches controlled by an up pulse control signal for controlling current flow such that in a charging mode of the circuit, the second current flows from the second node through the output node and through the resistor to the fifth node, and the first current flows from the first node through the intermediate node to the first capacitor for charging the first capacitor; and
   a plurality of down pulse switches controlled by a down pulse control signal for controlling current flow such that in a discharging mode of the circuit, the second current flows from the fifth node through the resistor and out through the second output current source, and the first current flows from the first capacitor through the intermediate node and out through the first output current source for discharging the first capacitor.

2. The circuit of claim 1 wherein the reference level is ground.

3. The circuit of claim 1 wherein the plurality of up pulse switches comprises a first up pulse switch and a second up pulse switch, the first up pulse switch being connected between the first node and the intermediate node, and the second up pulse switch being connected between the second node and the output node, and the plurality of down pulse switches comprises a first down pulse switch and a second down pulse switch, the first down pulse switch being connected between the intermediate node and the third node, and the second down pulse switch being connected between the output node and the fourth node.

4. The circuit of claim 3 wherein when the up pulse control signal is active and the circuit is in the charging mode, the first and second up pulse switches close and the first and second down pulse switches open, and when the down pulse control signal is active and the circuit is in the discharging mode, the first and second down pulse switches close and the first and second up pulse switches open.

5. The circuit of claim 1 wherein the first factor is less than one and the second factor is equal to one.

6. The circuit of claim 1 wherein the up pulse switches and the down pulse switches are transistors.

7. The circuit of claim 1 wherein the unit gain buffer is a source follower or an emitter follower.

8. The circuit of claim 1 wherein the unit gain buffer is an operational amplifier with direct feedback, forming a voltage follower.

* * * * *